(12) United States Patent
Han

(10) Patent No.: US 9,625,941 B2
(45) Date of Patent: Apr. 18, 2017

(54) TOUCH WINDOW

(71) Applicant: LG INNOTEK CO., LTD., Seoul (KR)

(72) Inventor: Jae Heung Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/750,508

(22) Filed: Jun. 25, 2015

(65) Prior Publication Data

US 2015/0293561 A1    Oct. 15, 2015

Related U.S. Application Data

(63) Continuation of application No. 13/477,783, filed on May 22, 2012, now Pat. No. 9,348,360.

(30) Foreign Application Priority Data

May 26, 2011  (KR) .................. 10-2011-0050350

(51) Int. Cl.
*G06F 1/16*  (2006.01)
*G06F 3/044*  (2006.01)
*H03K 17/96*  (2006.01)

(52) U.S. Cl.
CPC ............. *G06F 1/16* (2013.01); *G06F 3/044* (2013.01); *H03K 17/9622* (2013.01); *G06F 2203/04102* (2013.01); *G06F 2203/04111* (2013.01); *H03K 2017/9602* (2013.01); *H03K 2217/96023* (2013.01); *H03K 2217/96031* (2013.01); *H03K 2217/960755* (2013.01)

(58) Field of Classification Search
CPC .......... G06F 1/16; G06F 3/041; G06F 3/0412; G06F 3/0416; G06F 3/0418; G06F 3/044; G06F 3/0487; G06F 3/0488; G06F 3/0489–3/04897; G06F 2203/04102; G06F 2203/04103; G06F 2203/04111–2203/04113; H03K 17/96; H03K 17/962; H03K 17/9622; H03K 2017/9602; H03K 2017/96023; H03K 2017/96031; H03K 2017/960755
See application file for complete search history.

(56) References Cited

U.S. PATENT DOCUMENTS

| 7,595,794 | B2 | 9/2009 | Miyake et al. |
| 2005/0190161 | A1 | 9/2005 | Hong et al. |
| 2009/0101417 | A1 | 4/2009 | Suzuki et al. |

(Continued)

FOREIGN PATENT DOCUMENTS

KR  10-1026522 B1  4/2011

OTHER PUBLICATIONS

Office Action dated Aug. 6, 2015 in U.S. Appl. No. 13/477,783.

*Primary Examiner* — Nathan Danielsen
(74) *Attorney, Agent, or Firm* — Saliwanchik, Lloyd & Eisenschenk

(57) ABSTRACT

Disclosed is a touch window according to the present invention in which a FPCB, an IC, a function key area for a connection with a touch sensing sensor electrode are all formed in a single printed circuit board and are formed not to be exposed to the outside by receiving the printed circuit board in a lower part of a transparent window, thereby being capable of simplifying a structure of the touch window.

7 Claims, 6 Drawing Sheets

(56) References Cited

U.S. PATENT DOCUMENTS

| | | |
|---|---|---|
| 2009/0267916 A1 | 10/2009 | Hotelling |
| 2009/0273577 A1* | 11/2009 | Chen ........................ G06F 3/044 345/174 |
| 2010/0007627 A1 | 1/2010 | Lai et al. |
| 2010/0045632 A1* | 2/2010 | Yilmaz ................... G06F 3/044 345/174 |
| 2010/0060601 A1 | 3/2010 | Oohira |
| 2010/0075720 A1 | 3/2010 | Lee et al. |
| 2010/0328254 A1 | 12/2010 | Niga et al. |
| 2011/0007011 A1 | 1/2011 | Mozdzyn |
| 2011/0210939 A1* | 9/2011 | Reynolds ................ G06F 3/044 345/174 |
| 2011/0273398 A1 | 11/2011 | Ho et al. |
| 2012/0098782 A1 | 4/2012 | Nam |
| 2012/0262382 A1* | 10/2012 | Guard ..................... G06F 3/044 345/173 |

\* cited by examiner

TOUCH WINDOW

CROSS-REFERENCE TO RELATED APPLICATION

This application is a continuation of U.S. application Ser. No. 13/477,783, filed May 22, 2012, which claims priority to Korean Application No. 10-2011-0050350, filed May 26, 2011, which are herein incorporated by reference in their entirety.

BACKGROUND

Field of the Invention

The present invention relates to a technology which is capable of simplifying a structure of a touch window.

Description of the Related Arts

FIGS. 1 and 2 illustrate main elements of an electrostatic capacity type touch panel. FIG. 1 illustrates a plane view of a bonded structure of a multi-layered structure and FIG. 2 illustrates a cross-sectional view cut along line X of FIG. 1. Referring to the illustrated drawings, a touch panel generally has a stacked structure comprising an upper OCA 50 below a transparent window 10, and an upper electrode layer (ITO) 40 therebelow, a lower OCS 30 therebelow, and a lower electrode layer 20 therebelow. To a lower part thereof, a liquid crystal display (LCD) panel 60 is bonded. A touch screen panel (TSP) formed by bonding these multi-layers has a bonding area C, where a connection pad P is exposed by cutting the aforesaid upper OCA 50, upper electrode layer (ITO) 40, and lower OCA 30, in order to be bonded to a FPCB module.

FIG. 3 shows a plane concept view of a touch panel having the aforesaid structure. In a view area 10, a flexible printed circuit board (FPCB) is connected to the end of a wiring part, the aforesaid connection pad P. The FPCB is connected to a printed circuit board (PCB) 70 having a main IC of the exterior via a connector 90. A touch IC 80 may be mounted in the printed circuit board (PCB) 70 having the main IC.

However, in this structure, the flexible printed circuit board itself is weak structurally. In particular, when bonding it, a connection force has a limit. When a connection with an external printed circuit board is performed, a connection defect has been frequently generated as a problem.

BRIEF SUMMARY

An aspect of the present invention is directed to provide a touch window capable of solving the aforementioned problems.

Another aspect of the present invention is directed to provide a touch window including function keys wherein a FPCB, an IC and a function key area for a connection with a touch sensing sensor electrode are all formed in a single printed circuit board and are formed not to be exposed to the outside by receiving the printed circuit board in the lower part of a transparent window, thereby being capable of simplifying a structure of the touch window.

Exemplary embodiments of the present invention are directed to provide a touch window, comprising: a transparent window; a touch sensor module disposed in a lower part of the transparent window and implementing a view area V/A and a dead area D/A via a sensing electrode pattern layer; and a printed circuit board electronically connected to the touch sensor module and including a circuit for receiving and treating signal input of function keys F formed on a surface of the transparent window, wherein the touch sensor module and the printed circuit board are received inside a plane lower part of the transparent window.

In accordance with exemplary embodiments, the present invention is advantageous that the touch window including function keys can simplify its structure in such a manner that a FPCB, an IC, a function key area are all formed in a single printed circuit board and are formed not to be exposed to the outside by receiving the printed circuit board in the lower part of a transparent window.

According to an aspect of an exemplary embodiment of the present invention, a touch window may include: a substrate; a first sensing electrode pattern which is a curvature pattern on the substrate; a second sensing electrode pattern crossing the first sensing electrode pattern; and a wiring connected to the first sensing electrode pattern or the second sensing electrode pattern.

According to another exemplary embodiment, the first sensing electrode pattern may be a curvature pattern having periodicity.

According to still another exemplary embodiment, the first sensing electrode pattern may be formed in a sine type curvature pattern or a cosine type curvature pattern.

According to still another exemplary embodiment, the first sensing electrode pattern and the second sensing electrode pattern may overlap with each other.

According to still another exemplary embodiment, the first sensing electrode pattern and the second sensing electrode pattern may overlap with each other at an acute angle or an obtuse angle.

According to still another exemplary embodiment, the first sensing electrode pattern and the second sensing electrode pattern may overlap with each other at an inflection point of the first sensing electrode pattern.

According to still another exemplary embodiment, the first sensing electrode pattern and the second sensing electrode pattern may be disposed on different substrates.

According to still another exemplary embodiment, the second sensing electrode pattern may be disposed between an nth curvature part and a (n+1)th curvature part, wherein n represents a natural number.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION

Figure 1:
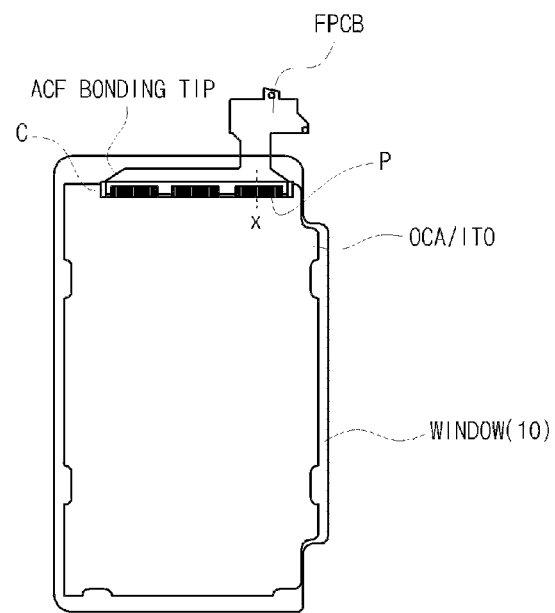
FIGS. 1 and 2 are a plane view and a cross-sectional view of the subject matters illustrating a structure of a conventional touch window.
Figure 2:
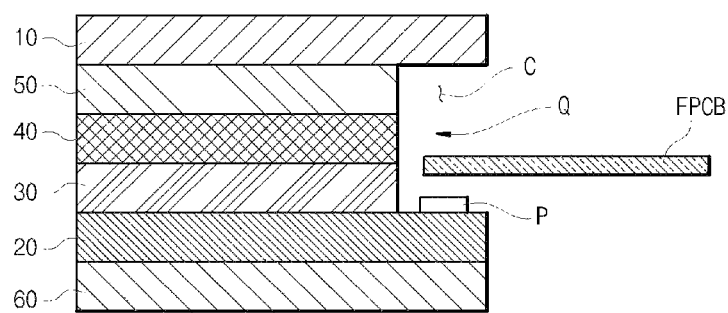
Figure 3:
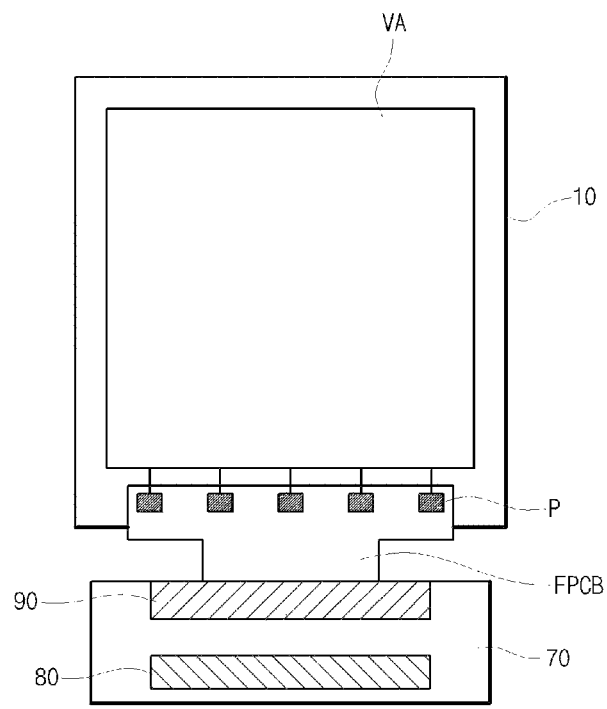
FIG. 3 is a concept view illustrating a connection structure of a conventional connection pad and a FPCB.

Exemplary embodiments according to the present invention will now be described more fully hereinafter with reference to the accompanying drawings. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

First Exemplary Embodiment

Figure 4:
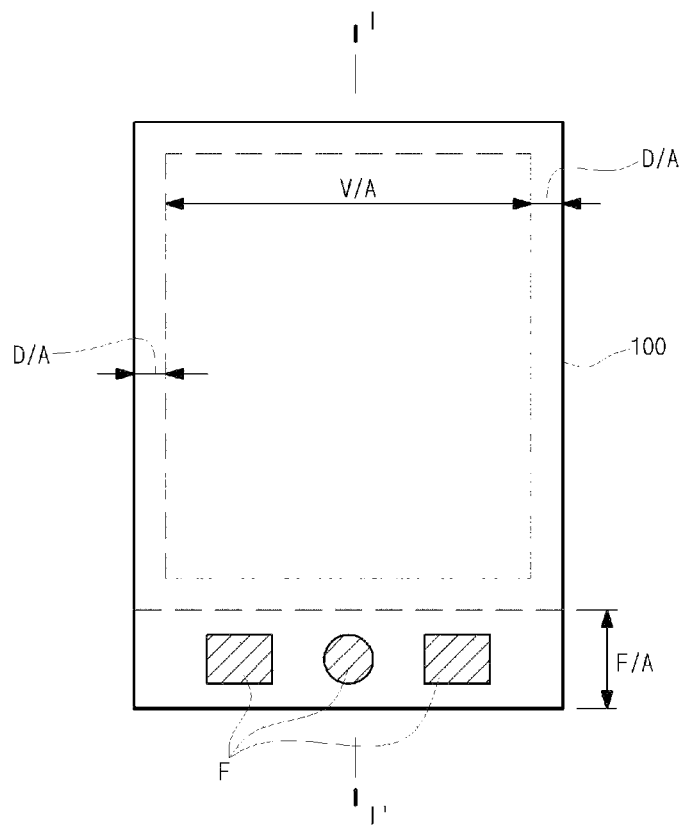
FIG. 4 is a plane view of a touch window according to the present invention.
Figure 5:
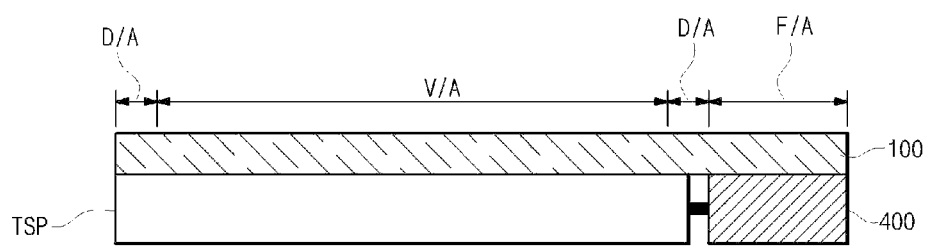
FIG. 5 is a cross-sectional view taken along line I-I' of FIG. 4.

FIG. 4 illustrates a plane view of a touch window according to present invention, and FIG. 5 illustrates a cross-sectional view taken along line I-I' of FIG. 4.

Referring to the structures illustrated in FIGS. 4 and 5, a touch window according to the present invention is configured such that a transparent window is basically provided on a top layer, and a touch sensor module for sensing a sensing signal using a touch is provided in a lower part of the transparent window.

Specifically, the touch window according to the present invention comprises: a transparent window 100 for receiving a contact through a touch of the outside; a touch sensor module (TSP) disposed in a lower part of the transparent window 100 and implementing a view area V/A and a dead area D/A via a sensing electrode pattern layer; and a printed circuit board 400 electrically connected to the touch sensor module (TSP) and including a circuit for receiving and treating the signal input of function keys F. Furthermore, an area of the touch window where function keys F are disposed is defined as a function key area F/A. Particularly, in the present invention, when the printed circuit board is seen from above, it may be disposed to be completely covered by a lower part of the transparent window.

Moreover, a wiring part is connected to a sensing electrode of the inside of the touch sensor module (TSP). The wiring part to which view display of the touch sensor module (TSP) and a touch sensing panel are applied is connected to a control part (now shown) for determining the number and position of a touch and controlling an operation of the touch sensor module (TSP). In this case, in order to correspond to the shapes of various apparatuses in the inside of electronic equipment, a flexible printed circuit board (FPCB) is used. A circuit pattern formed in the printed circuit board is connected to a connection pad, thereby receiving a sensing signal and determining whether or not a touch occurs and a position where a touch occurs by using the received sensing signal. The present invention is characterized in that the printed circuit board may be disposed in the lower part of the transparent window.

Figure 6:
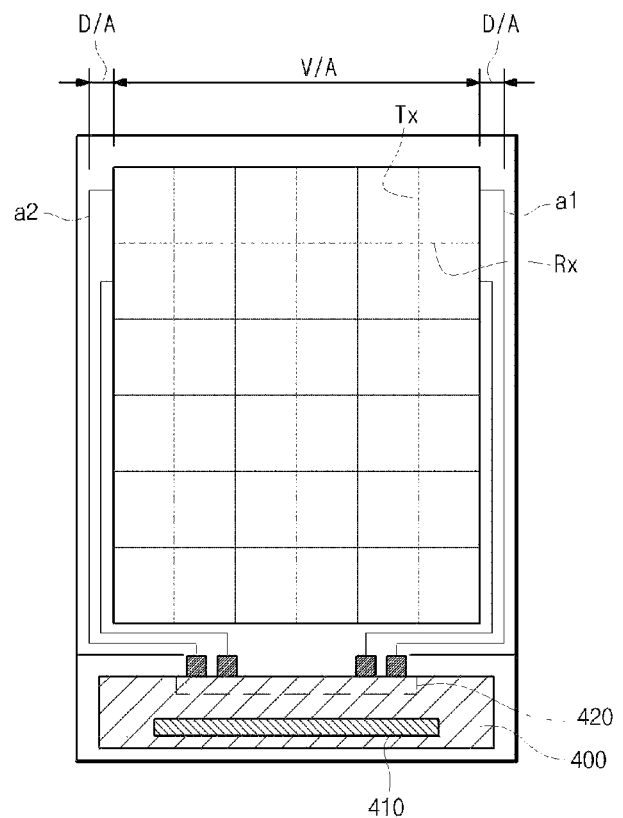
FIG. 6 is a plane concept view of the subject matters according to the present invention.

FIG. 6 is a concept view illustrating an inner configuration of FIG. 4. The printed circuit board 400 further comprises a touch IC 410 for receiving touch signals of the sensing electrode pattern layers Tx and Rx in the wiring parts a1 and a2.

In particular, in the printed circuit board according to the present invention, a connection of the connection pad P of the wiring part connected to the sensing electrode patter layer and the printed circuit board 400 may be implemented using a connector 420 or a flexible printed circuit board (FPCB).

Figure 7:
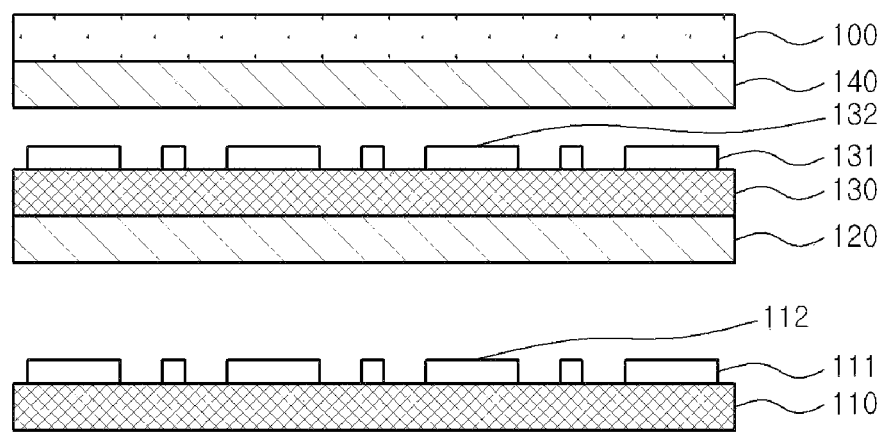
FIG. 7 is a cross-sectional concept view of a touch sensor module of a touch screen according to the present invention.

Moreover, in the aforesaid structure, the touch sensor module (TSP) formed in the lower part of the transparent window 100 may be formed in the structure as illustrated in FIG. 7.

That is, the touch sensor module may include base substrates 130 and 110; and sensing electrodes 132 and 112 patterned on one surface of the base substrates or on other surface opposed to the one surface. That is, the touch sensor module may further include a first sensing electrode pattern layer bonded to the transparent window 100 via a first adhesive material layer 140, and having a sensing electrode pattern 132 on one surface and a second sensing electrode pattern layer bonded to other surface of the first sensing electrode pattern layer via a second adhesive material layer 120, and having a sensing electrode pattern 112 on one surface. In this case, the first sensing electrode pattern 132 and the second sensing electrode pattern 112 are formed on different base members 130, 110 from each other, respectively to be spaced apart from each other. Also, the first and second sensing electrode patterns may be implemented in a structure in which an overlapping region Q1 on a plane is formed at a disposition in which the first and second sensing electrode patterns are spaced apart from each other.

Figure 8:
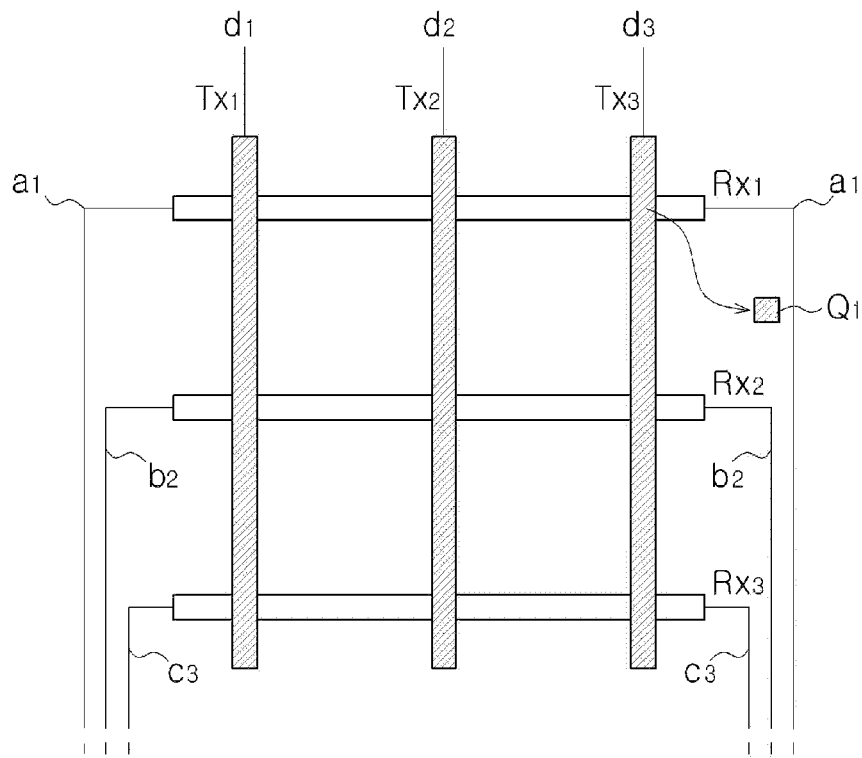
FIG. 8 to FIG. 10 illustrate various exemplary embodiments having pattern structures of a sensing electrode of a touch window according to the present invention.

Like the structure illustrated in FIG. 8, a second sensing electrode pattern Rx1 formed to be spaced apart from a first sensing electrode pattern Tx1 is formed in a linear type, and the first sensing electrode pattern and the second sensing electrode pattern may be implemented to overlap each other. In particular, each wiring part is connected to each both end of the unit sensing electrode patterns, namely, Rx1, Rx2 and Rx3 which form the sensing electrode pattern layer according to the present invention. That is, unit wiring parts a1 and a2 are connected to both ends of Rx1, and unit wiring parts b1 and b2 are connected to both ends of Rx2. That is, a structure which has the unit wiring parts connected to both ends of the unit sensing electrode, respectively is provided so that wirings is provided to both sides of a sensing area, thereby being capable of improving a sensing capacity by reducing the charge time of electrodes for sensing. Of course, the wiring parts may be also connected to both ends of Tx1, Tx2 and Tx3, respectively which form the first sensing electrode pattern. That is, the aforesaid FIG. 6 is a plane view of really implementing a double routing structure in which each wiring part is formed at both ends of the second sensing electrode patterns Rx1, Rx2 and Rx3. This structure is advantageous that a structure which has the unit wiring parts connected to both ends of the unit sensing electrode of the first sensing electrode pattern or the second sensing electrode patter of the touch window is provided so that wirings are provided to both sides of a sensing area, thereby being capable of improving a sensing capacity by reducing the charge time of electrodes for sensing.

The touch window including function keys according to the aforesaid present invention is advantageous that a FPCB, an IC and a function key area for a connection with a touch sensing sensor electrode are all formed in a single printed circuit board and are formed not to be exposed to the outside by receiving the printed circuit board the lower part of a transparent window, thereby being capable of simplifying a structure of the touch window.

Second Exemplary Embodiment

The technical gist of the second exemplary embodiment is identical with that the first exemplary embodiment according to the present invention which is directed to the touch window including function keys wherein a FPCB, an IC and a function key area for a connection with a sensing sensor electrode are all formed in a single printed circuit board. The touch sensor module (TSP) having a different structure from that of the electrode pattern of FIG. 8 may be also implemented.

Figure 9:
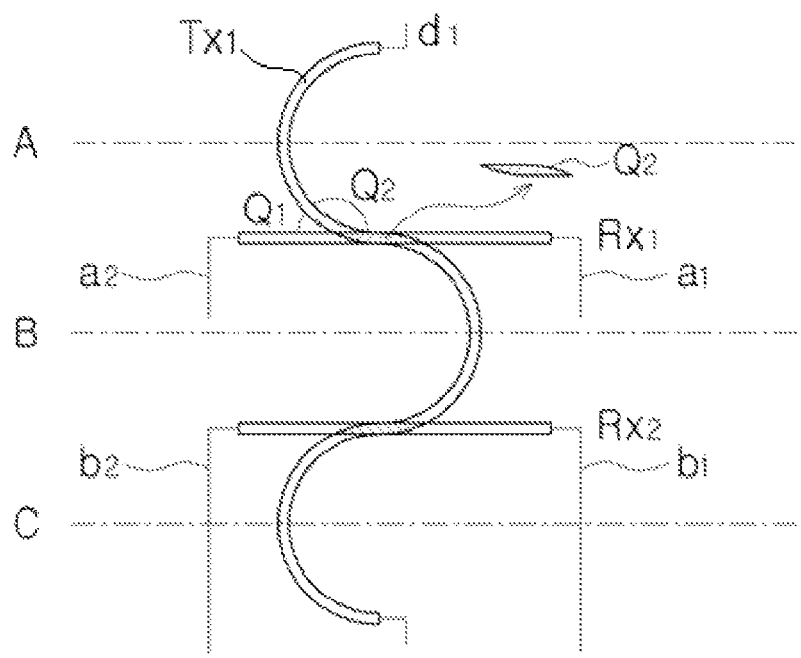

That is, as illustrated in FIG. 9, in the case where a structure of the sensing electrode pattern is implemented so that the first and second sensing electrode patterns overlap each other, one of the sensing electrode patterns is implemented as a curvature pattern.

That is, the sensing electrode pattern layer according to this exemplary embodiment is configured such that two sensing electrode pattern layers are disposed to be spaced apart from each other in opposite directions. Furthermore, shapes of the disposed patterns overlap each other, and one of the patterns is formed to have a curvature with fixed periodicity. That is, as illustrated in FIG. 9, the first sensing electrode pattern Tx1 may have a curvature pattern with fixed periodicity, and the second sensing electrode pattern Rx1 formed to be spaced apart from the first sensing electrode pattern may be formed in a linear type. That is, in the structure of FIG. 7, the first sensing electrode pattern 132 and the second sensing electrode pattern 112 are respectively formed on different base members 130 and 110 from each other to be spaced apart from each other. However, on the plane seen from above, the first sensing electrode pattern 132 is configured such that a curvature pattern is formed, and the second sensing electrode pattern 112 is formed in a linear type, so that an overlapping region (Q2 of FIG. 9) may be formed in a shape other than a rectangular shape or a square shape to be larger than the overlapping region of FIG. 8.

In the present invention, the curvature pattern is hereinafter defined as including all patterns which have fixed periodicity, and crest and trough shapes, but which are not a linear type. Particularly, as illustrated in FIG. 9, a sine type curvature pattern or a cosine type curvature pattern in which the crests and troughs S1, S2 and S3 are periodically repeated may be provided. In addition to this structure, the curvature pattern may be formed in a structure in which zigzag type linear bendings are periodically repeated. The line segments A and B of FIG. 9 are imaginary line segments which pass through the peak of the crests and troughs of each curvature pattern.

In particular, the curvature pattern having periodicity may be formed in a structure in which the sensing electrode pattern in a linear type is disposed between an n curvature part and a (n+1) curvature part (n presents a natural number of more than 1.) Referring to the structure illustrated in FIG. 9, the second sensing electrode pattern Rx1 in a linear type is disposed between a first curvature part S1 and a second curvature part S2 of the first sensing electrode pattern Tx1. As one example, this exemplary embodiment shows a case that the first sensing electrode pattern is a curvature pattern. However, on the contrary to this, the first sensing electrode pattern may be implemented as a linear pattern and the second sensing electrode pattern may be implemented as a curvature pattern. Moreover, angles $\theta_1$ and $\theta_2$ in which the sensing electrode pattern Tx1 and the second sensing electrode pattern Rx1 overlap each other may be formed as an acute angle or an obtuse angle rather than a right angle.

Moreover, in the case where the curvature pattern according to the present invention has sine type or cosine type periodicity, the second sensing electrode pattern may be formed to pass through and cross a ½ position of the first curvature part and the second curvature part, namely, the position of an inflection point. This disposition structure realizes the effect that a touch sensing efficient can be improved by maximizing a cross area Q2 and visibility can be improved by making an optical property clearer than that of the disposition of a conventional cross structure. In the structure as illustrated in FIG. 7, the first and second adhesive insulation layers may be an OCA film. The first and second sensing electrode pattern layers may be implemented to include the sensing electrode patterns which are formed of one selected from indium tin oxide (ITO), indium zinc oxide (IZO), zinc oxide (ZnO), carbon nanotubes (CNT), Ag nanowires, conductive polymers, or grapheme on the base member. Unlike the aforesaid structure, wiring parts 111 and 131 for connecting the second and first sensing electrode patterns 112 and 132, respectively, are formed, and a process of simultaneously forming the wiring parts and the sensing electrode patterns using a conductive material such as Ag, Al, Cu rather than using a transparent electrode material may be used. This can solve the problems in that when a pattern of the electrode using an ITO material is formed, a shape of the pattern is seen, in that the production cost increases due to the ITO material that is an expensive material, and in that it would be difficult to realize a structure having a double-sided ITO material layer on a single base substrate due to the degradation in film hardness of the ITO material. Accordingly, it is advantageous that the production cost is reduced by a process of simultaneously forming a valid part and a wiring part by forming and patterning the conductive material instead of the ITO material on an optical member, and that a process capable of realizing the freedom of various designs regardless of the degradation in film hardness is provided.

Third Exemplary Embodiment

Figure 10:
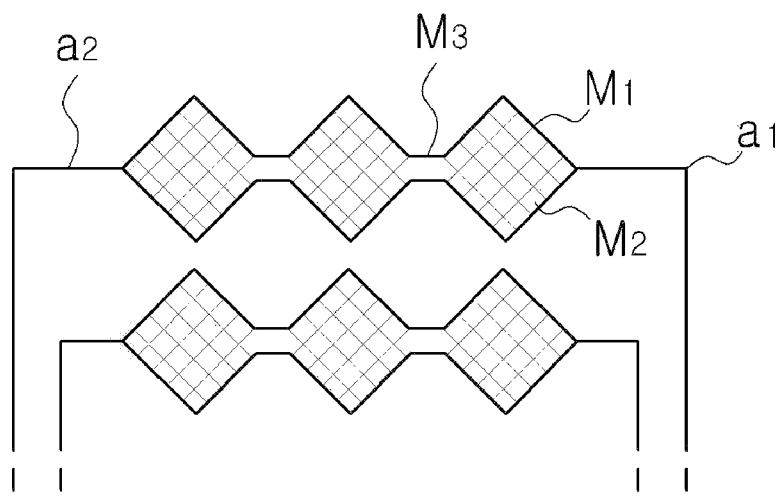

The technical gist of the third exemplary embodiment is identical with that of the touch window including function keys having the structure according to the first exemplary embodiment of the present invention wherein a FPCB, an IC and a function key area for a connection with a touch sensing sensor electrode are all formed in a single printed circuit board. Like the structure illustrated in FIG. 10, the touch sensor module having a structure in which the electrode pattern is formed in a mesh type may be implemented.

That is, unlike the second exemplary embodiment, the sensing electrode pattern according to the third exemplary embodiment is characterized in that one pattern of the sensing electrode patterns, namely, a unit pattern, is formed in a mesh structure. In this exemplary embodiment, the mesh structure is defined as a structure that includes an external line pattern M1 for forming an exterior angle part of the unit patterns and an internal line pattern M2 for connecting an inside of the external line pattern in a cross structure. In particular, the external line pattern M1 may be implemented in various shapes such as a circular shape and an elliptical shape as well as a polygonal shape and may be formed of a conductive material in a line shape.

Furthermore, as illustrated, the internal line pattern M2 may be formed by the collection of lines for connecting the inside of the external line pattern M1 in a cross structure. That is, the number of patterns having a linear structure may be formed in a net structure to cross each other. Of course, the disposition in various curved structures as well as a straight-line structure may be also applied. The sensing electrode of the mesh structure according to the present invention may transmit an electrical signal by forming lines continued by a conductive material of 3 μm~10 μm in a polygonal mesh shape.

In the case, signal transmission efficiency can be largely increased by controlling a line width and a cross angle in the cross structure of the internal pattern line M2 in the mesh structure. Moreover, a process of simultaneously producing the wiring part and the sensing electrode pattern with the same material as each other is implemented, thereby being capable of increasing process efficiency. In addition to, because the ITO material is not used, the process cost can be largely reduced. Accordingly, the signal transmission efficiency resulting from the reduction of a material cost and a process cost is improved by the mesh structure, thereby realizing a product of high efficiency. Various materials such as Ag, Cu, Al may be applied to the conductive material used for the wiring and the sensing electrode used in the present invention.

That is, in the case of in the third exemplary embodiment, an electrode is not formed using a transparent electrode material, but with regard to the wiring parts 111 and 131 for connecting the second and first sensing electrode patterns 112 and 132, respectively, a process of simultaneously forming the wiring part and the sensing electrode pattern using the conductive material such as Ag, Al and Cu may be used. This can solve the problems in that when a pattern of the electrode is formed using an ITO material, a shape of the pattern is seen, in that the production cost increases due to the ITO material that is an expensive material, and in that it would be difficult to realize a structure which has a double-sided ITO material layer on both surface of the single base substrate due to the degradation in film hardness of the ITO material. Thus, it is advantageous that the production cost is reduced by the process of simultaneously forming the valid part and the wiring part by forming and patterning the conductive material instead of the ITO material on the optical member, and that a process capable of realizing the freedom of various designs regardless of the degradation in film hardness is provided.

Fourth Exemplary Embodiment

Figure 11:
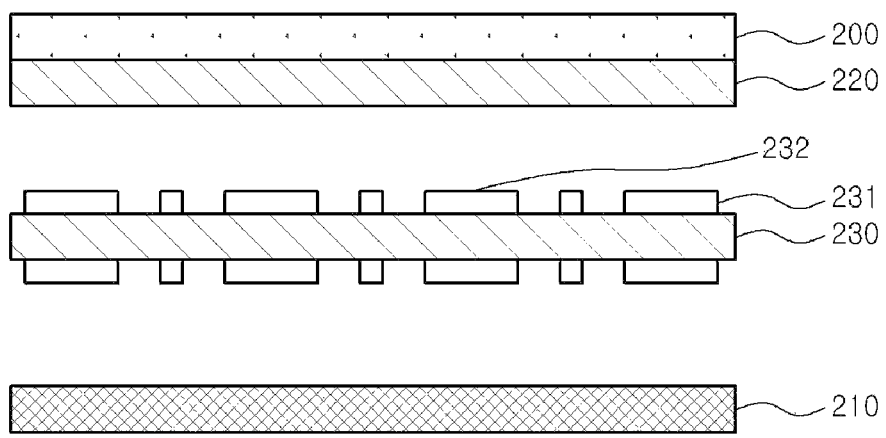
FIG. 11 and FIG. 12 illustrate other exemplary embodiments having other structures of a touch window according to the present invention.

The shapes of the touch sensor module explained in the first exemplary embodiment to the third exemplary embodiment may be manufactured in the structure illustrated in FIG. 11 as follows.

Unlike the structure illustrated in FIG. 7, the pattern of a sensing electrode 232 is formed at both surfaces of a base substrate 230. In view of this, there is a difference between the structures. Also, a wiring part 231 for connecting both ends of the sensing electrode in a double routing structure is formed. The structures, modification scopes and materials stated in the first exemplary embodiment to the third exemplary embodiment may be exactly applied to the pattern of the sensing electrode 232. Furthermore, patterning the sensing electrode and the wiring part at the same time and forming them with the conductive material may be identically applied. Moreover, a protective film 210 for protecting the sensing electrode pattern of a lower surface of the base substrate 230 may be further provided.

Fifth Exemplary Embodiment

Figure 12:
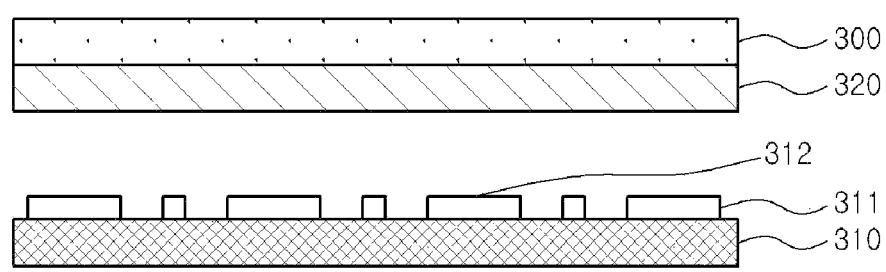

Referring to FIG. 12, unlike in the other exemplary embodiments as stated above, a transparent window 300 is formed, a sensing electrode pattern 312 is patterned on the end surface of a base substrate 310, and a wiring part 311 is simultaneously formed with the sensing electrode pattern. The first and second sensing electrode patterns are implemented on the same plane as each other. The first sensing electrode layer for determining a first axis (for example, an X axis) component of a contact may be patterned on one surface and the second sensing electrode layer for determining a second axis (for example, a Y axis) component of a contact may be patterned by implementing the disposition in which the second sensing electrode layer is insulated from the first sensing electrode layer.

Of course, as one example, FIG. 12 shows the configuration wherein the sensing electrode pattern layer is formed on the same plane as the separate base substrate 310. However, without the base substrate 310, the sensing electrode pattern may be directly formed on one surface of the transparent window 300 through deposition and coating processes. In this case, the matters that the sensing electrode and the wiring pattern according to the present invention are simultaneously formed of the same material as each other, and that the sensing electrode is implemented in the aforesaid mesh structure are identical to the other exemplary embodiments.

The touch window according to the present invention may be attached to various display devices. That is, the display devices may be an organic light emitting device and a plasma display panel as well as a liquid crystal display. At this time, to prevent an operation error of the touch sensing panel caused because a noise component generated by the drive of a display device is transmitted to the touch sensor module, namely, a touch screen panel (TSP), a shield layer may be selectively disposed between the touch sensing panel and the display device.

In the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A touch window, comprising:
   a substrate;
   a first sensing electrode pattern which is a curvature pattern on the substrate; a second sensing electrode pattern crossing the first sensing electrode pattern; and
   a wiring connected to the first sensing electrode pattern or the second sensing electrode pattern,
   wherein the first sensing electrode pattern is formed in a sine type curvature pattern or a cosine type curvature pattern.

2. The touch window of claim 1, wherein the first sensing electrode pattern is a curvature pattern having periodicity.

3. The touch window of claim 1, wherein the first sensing electrode pattern and the second sensing electrode pattern overlap with each other.

4. The touch window of claim 3, wherein the first sensing electrode pattern and the second sensing electrode pattern overlap with each other at an acute angle or an obtuse angle.

5. The touch window of claim 3, wherein the first sensing electrode pattern and the second sensing electrode pattern overlap with each other at an inflection point of the first sensing electrode pattern.

6. The touch window of claim 1, wherein the first sensing electrode pattern and the second sensing electrode pattern are disposed on different substrates.

7. The touch window of claim 1, wherein the second sensing electrode pattern is disposed between an $n^{th}$ curvature part and a $(n+1)^{th}$ curvature part, wherein n represents a natural number.

* * * * *